United States Patent [19]
Xing

[11] Patent Number: 6,141,251
[45] Date of Patent: Oct. 31, 2000

[54] NON-VOLATILE MEMORY ARRAY HAVING AN INDEX USED IN PROGRAMMING AND ERASING

[75] Inventor: Dongsheng Xing, Fremont, Calif.

[73] Assignee: Silicon Storage Technology, Inc., Sunnyvale, Calif.

[21] Appl. No.: 09/494,185

[22] Filed: Jan. 28, 2000

[51] Int. Cl.$^7$ .................................................. G11C 16/04
[52] U.S. Cl. ............................. 365/185.11; 365/185.29; 365/185.33
[58] Field of Search ...................... 365/185.11, 185.29, 365/185.33; 711/156, 103, 163

[56] References Cited

U.S. PATENT DOCUMENTS

| | | | |
|---|---|---|---|
| 5,388,069 | 2/1995 | Kobuko | 365/185.3 |
| 5,694,359 | 12/1997 | Park | 365/185.09 |
| 5,963,478 | 10/1999 | Sedlak | 365/185.29 |
| 5,963,970 | 10/1999 | Davis | 711/103 |

*Primary Examiner*—Andrew Q. Tran
*Attorney, Agent, or Firm*—Limbach & Limbach LLP

[57] ABSTRACT

In a non-volatile memory array where the memory cells in a sector are programmed together and a plurality of sectors form a segment which are erased together, through the use of a free list linking entries in a register with each entry in a register corresponding to a free segment, a free list table is created which readily simplifies searches for segments that are available for erasure. In addition, through the creation of a segment number table and a count index, determination of particular valid sectors in particular segments can be readily identified.

18 Claims, 2 Drawing Sheets u(n)

FREE LIST TABLE

NON-VOLATILE MEMORY ARRAY HAVING AN INDEX USED IN PROGRAMMING AND ERASING

TECHNICAL FIELD

The present invention relates to a non-volatile memory array arranged in a plurality of segments with each segment having a plurality of sectors that are erased in the same erase operation. Each sector has a plurality of memory cells that are programmed in the same programming operation. The memory array has an index which is used to identify segments and sectors to be used in the erase and programming operations, respectively.

BACKGROUND OF THE INVENTION

Non-volatile memory arrays such as flash memory arrays are well known in the art. Referring to FIG. 1, there is shown a typical prior art architecture of a non-volatile memory array 10. For the purpose of the present disclosure, the non-volatile memory array 10 shown in FIG. 1 has the capacity to store 32 megabytes. Although, as it is well known in the art, the present disclosure and the invention is not limited to 32 megabytes.

In the prior art, the memory array 10 is divided into a plurality of sectors shown as $S_0 \ldots S_{65535}$. Each sector has 512 bytes, labeled as B0 . . . B511 with 16 control bytes labeled as C0–C15. The 16 control bytes associated with each sector stores signals indicative of error correction, control information and the status of the cells in that sector. Thus, in total, there are 32 megabytes of user storable non-volatile storage. (It should be clear to those of ordinary skill in the art that the memory array 10 shown in FIG. 1 is only of one plane, i.e. 1 bit with 7 other planes forming a total of 8 bits or one byte for each one of the 512 bytes in a sector.) Typically, in the prior art, the sectors are arranged such that all the non-volatile memory storage sites (or bits) within a sector are programmed simultaneously. Further, typically, 16 or more sectors form one segment. Thus, in the memory array 10 of the prior art, there are 4096 segments labeled as SG0 . . . SG4095. Typically, all 16 sectors within a segment are erased simultaneously.

Each sector can have a number of status. It can have the status that it is a valid sector having valid data stored therein. It can also have the status that the data therein is invalid and is ready to be erased. Finally, each sector can have the status that the sector has been erased.

In order for a controller (not shown) to control the erasing and programming of the memory array 10, the controller must know the status of each of the sectors. In the prior art, this has been accomplished by simply reading the control bytes associated with each sector to determine if the sector data is:

1. Valid;
2. Invalid and is ready for erasure; or
3. Has been erased.

When all the sectors within a particular segment have been determined to have the status of invalid data, then all the sectors within that segment can be erased. Further, if only certain sectors are found to have valid data and other sectors have invalid data, then a merge operation can be performed to move all of the sectors having valid data into a different segment and then erase the sectors of that segment. All of the operations to search for free sectors or to find sectors of different segments for a merge operation can be time consuming. In particular, the simple task of locating sectors to determine the status of whether the data stored therein is valid, invalid, or erased is time consuming. For example, if searching one segment requires 200 microseconds, a search of 4096 segments would require 800 milliseconds or almost one full second. This time delay is not acceptable to the consumer.

SUMMARY OF THE INVENTION

To minimize the timing to search the status data in the sectors of a segment, in the present invention a plurality of groups of memory cells is provided. Each group of memory cells corresponds to a segment. Each group stores a signal indicative of the status of the corresponding segment of memory cells. Finally, each group stores an address signal indicative of another group of memory cells having the same status.

DETAILED DESCRIPTION OF THE DRAWINGS

Figure 1:
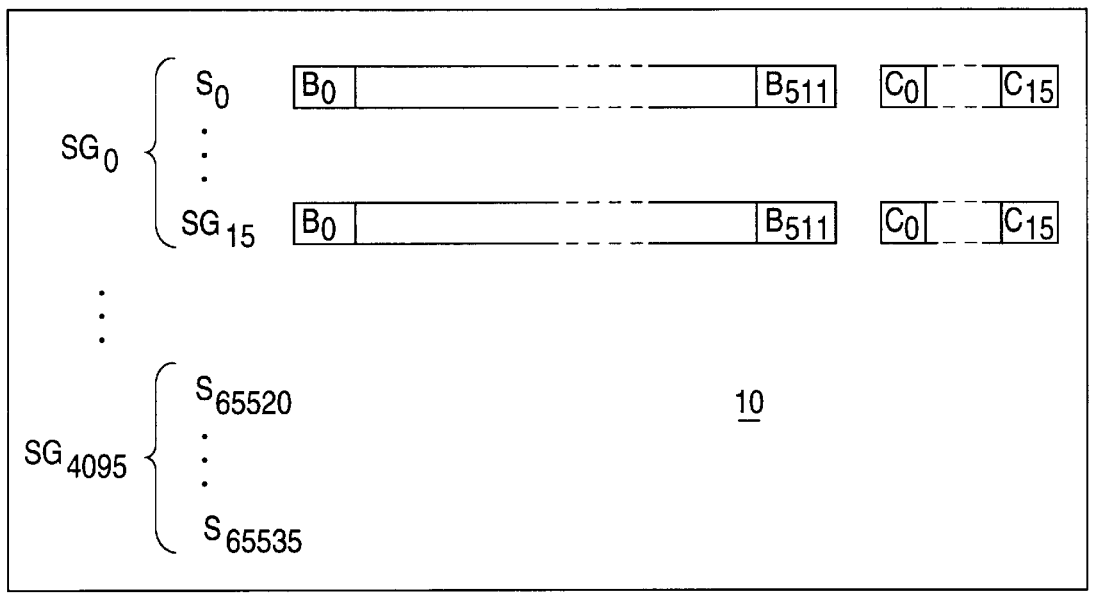
FIG. 1 is a schematic diagram of a layout of the sectors and segments of a memory array of the prior art.
Figure 2:
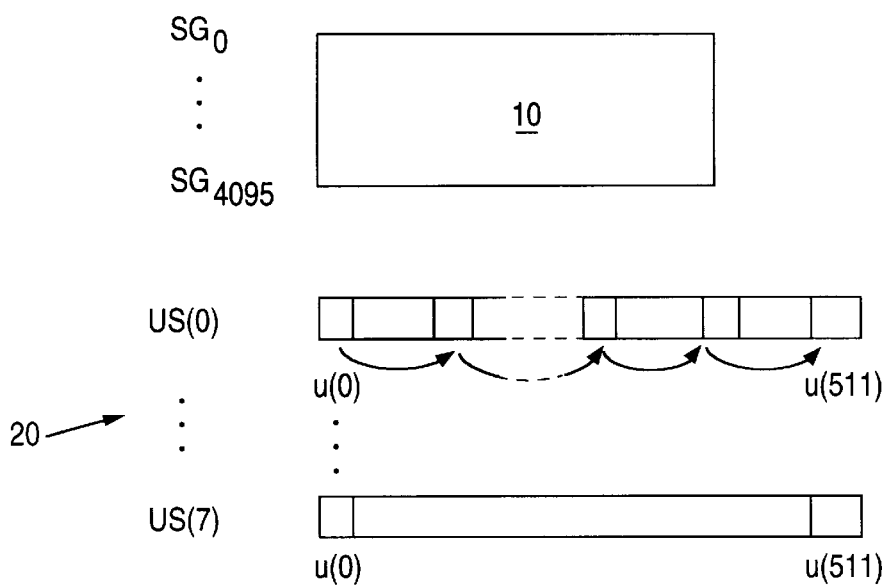
FIG. 2 is a schematic block level diagram of the present invention showing a memory array of non-volatile memory divided into a plurality of segments and sectors, with a register having a plurality of storage sites with each site corresponding to a segment and linked by an address of those corresponding segments having the same status.

As an example of the non-volatile memory array to which the present invention can be used, reference is made again to the memory array 10 shown in FIG. 1. However, as previously discussed, the present invention can be used with other densities of memory arrays and is not limited to a memory array 10 having 32 megabytes of storage. As previously discussed, the memory array 10 has 4096 segments with each segment having 16 sectors, with each sector having 512 bytes of non-volatile memory cells.

Further, in the memory array 20 of the present invention, a plurality of usage sectors, (US), with each use sector containing 512 bytes is provided. There are 8 US sectors labeled as US(0) . . . US(7). Each US sector has 512 bytes ranging from U(0) to U(511). Thus, there are 4096 bytes in total with each byte within the plurality of US sectors corresponding to one of the segments in the memory array 10.

Figure 3:
FIG. 3 is a detailed schematic diagram of the signal that is stored in one of the storage sites shown in FIG. 2.
Figure 3:
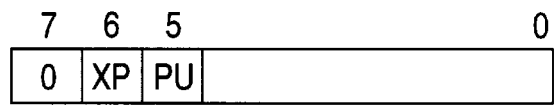

The signals stored in each byte of the US sectors is shown in FIG. 3. The leading bit of each byte can contain either 1 or 0 (in bit position #7) for each byte. If bit 7 stores "1", then the bit field from 0 to 6 thereafter is an integer from 0 to 127. The storage of a signal of 1 in bit 7 indicates that the corresponding segment is erased and is a "free segment" and can be used for programming. The 7 bits, bit fields 0–6, following the storage of "1" in bit 7, indicates the relative address of the next segment which also has the status of being a "free segment". If the address stored in bit fields 0–6 is a "127", then the segment is reserved for the US sectors. If the address stored in bit fields 0–6 is a "0" then it indicates that within the next 126 bytes, there is no corresponding segment that is a free segment. Therefore, for every 512 bytes within a US sector (corresponding to 512 segments) there may be at most 5 free segment link lists. This could be in positions of U(0), U(127), U(254), U(381) and U(508). Since there are 8 US sectors, a free list table for all 4096 segments of memory array 10 is at most 5×8 or 40 entries. Thus, the location of the free segments can be determined very quickly by simply keeping track of the 40 entries in 8 US sectors.

If bit 7 is "0", then that indicates the corresponding segment is not erased or is in use. Bit 6, labeled XP, means the corresponding segment is used for recording mapping information. This mapping information, called XPAGE, is disclosed in U.S. patent application Ser. No. 09/281,630, filed on Mar. 30, 1999, whose disclosure is incorporated herein by reference in its entirety. If this bit is set, the corresponding segment is used for XPAGE. Otherwise, it is a valid user data.

Bit 5, labeled PU indicates a valid sector count field. This bit is used to reducing the updating of the US sectors. To keep track of the number of valid sectors in a segment, there are two methods. In the first method, the valid sector count starts with zero. Every time a sector is programmed, the valid sector count is increased by one. Every time a sector is discarded, the valid sector count is decreased by one. In the second method, the valid sector count starts with 16. Every time a sector is programmed, the valid sector count remains unchanged. Every time a sector is discarded, the valid sector count is decreased by one.

Clearly the second method requires less updating of the valid sector count (which is in a US sector) compared to the first method. Further, since the US sector itself, in the preferred embodiment, is recorded on flash memory, it decreases the wear level of the memory cells of the US sectors. However, the second method may not have an accurate valid sector count. For example, if power off occurs after 5 sectors are programmed and 2 sectors are discarded, the valid sector count will be 14, with the second method, instead of 3, the actual sector count. In this case, bit 5, the PU bit is set to indicate that the segment is partially used. The valid sector count may not match the actual sector count. The PU bit, bit 5, is cleared once all the sectors in the segment are programmed. This requires only one additional updating of the US sector.

The valid sector count field (bits 0–4) is a count which indicates how many sectors within the segment have valid data. It begins with 16 which is assumed to be the number of sectors per segment. When a discard occurs, the discarded sector count is then deducted from the valid sector count field. When the valid sector count field reaches 0, that segment can be then erased and become a free segment. Whenever merge is necessary, those sectors with the least number in the valid sector count field can be chosen.

As previously discussed, each byte in the US sector that corresponds to a free segment has an address linking to another byte in the same US sector which is a free segment within the next immediately 126 bytes. If however a free segment is not found within the next 126 segments, then a value of 0 is stored as the address linking to the next available free segment. Thus, there can be at most 5 "lists" of linked free segments in each US sector. Since there are 8 US sectors, there can be at most 40 lists of linked free segments.

Figure 4:
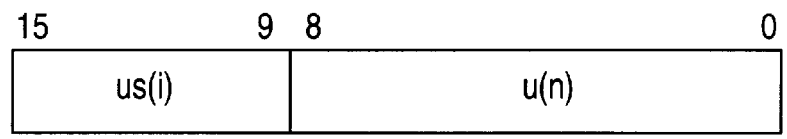
FIG. 4 is a schematic diagram of a free list table linking to the addresses for the data stored in the storage sites shown in FIG. 2.

Referring to FIG. 4, there is shown a free list table which stores the beginning of a free segment link list. Each free list of tables has 16 bits with 9 bits (bit 0–8) used to indicate the address within each US sector where the corresponding free segment is. Nine bits correspond to 512 entries which is exactly the number of bytes in each US sector. The other 7 bits (bits 9–15) are used to refer to the particular US sector. Although there are only 8 US sectors in the present example, it is clear that with the free list table from FIG. 4, up to 128 US sectors can be addressed in this manner. Thus, 1 free list entry occupies a 16 bit word. For a 32 Mb memory array 10, there need be at most 40 16 bit words of the form shown in FIG. 4 to store the beginning of each free list table.

From the foregoing, it can be seen that through the use of at most 40-16 bit words and 8 sectors with each sector of 512 bytes, searching for a free segment can be greatly simplified.

Figure 5:
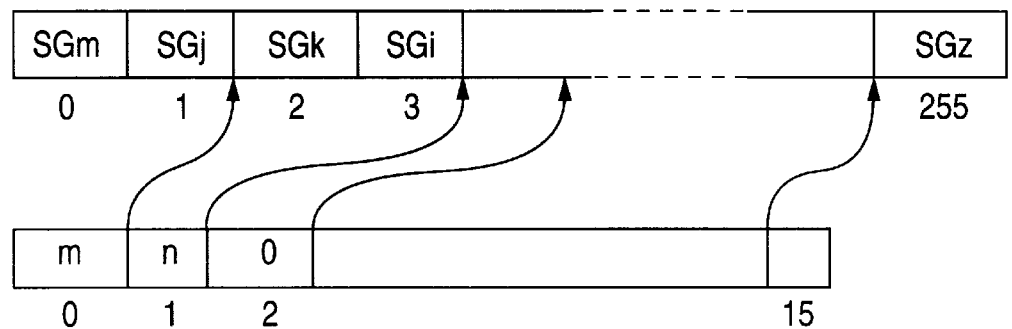
FIG. 5 is a schematic diagram of a segment number table and a count index table linking the status of the segments in the array 10 for use in a merge operation.

Another problem as noted in the "Background of the Invention" is the ability to quickly merge the valid data sectors from two or more segments into a single segment thereby permitting other segments to be erased and used. In order to accomplish this task, the number of sectors having valid data must be known. Thus, if a segment has 3 sectors of valid data, then those three sectors can be moved to another segment and this segment is ready to be erased and reused. To accomplish this task, reference is made to FIG. 5. A table called the SEGMENT_NUMBER table is provided. To conserve memory space, the SEGMENT_NUMBER table may only have a few hundred entries, such as 255, as shown in FIG. 5, which is much less than the total number of segments in memory array 10. The identity of the segments is stored in the SEGMENT_NUMBER table. Thus, each entry in the SEGMENT_NUMBER table stores a number which refers to the segment number. The segment numbers are stored in the SEGMENT_NUMBER table in accordance with the number of valid sectors within each segment. Thus, as shown in FIG. 5, segment m, (SGm), stored in SEGMENT_NUMBER(0) has the lowest number of valid sectors. Segment j, (SGj), has the next lowest number of valid sectors and so forth with segment z, (SGz), having the highest number of valid sectors.

A second index called the COUNT_INDEX is also provided. The COUNT_INDEX has a number of entries equal to the number of sectors within each segment. Thus, in this example, the COUNT_INDEX has 16 entries corresponding to the 16 sectors within each segment. The entries within the COUNT_INDEX store a number which is an index to the SEGMENT_NUMBER table. Thus, in COUNT_INDEX (0) is stored the number m. This indicates the identity of all the segments from SEGMENT_NUMBER(0) to SEGMENT_NUMBER(m−1) that have 0 valid sectors.

An example of the mechanism for determining the segments that have a certain number of valid sectors can be seen from the following example:

| | |
|---|---|
| SEGMENT_NUMBER(0) = 100 | COUNT_INDEX(0) = 2; |
| SEGMENT_NUMBER(1) = 111 | COUNT_INDEX(1) = 2; |
| SEGMENT_NUMBER(2) = 122 | COUNT_INDEX(2) = 4; |
| SEGMENT_NUMBER(3) = 133 | COUNT_INDEX(3) = 6; |
| SEGMENT_NUMBER(4) = 144 | COUNT_INDEX(4) = 7; |
| SEGMENT_NUMBER(5) = 155 | COUNT_INDEX(5) = 10; |
| SEGMENT_NUMBER(6) = 166 | COUNT_INDEX(6) = 12; |
| SEGMENT_NUMBER(7) = 177 | COUNT_INDEX(7) = 13; |
| SEGMENT_NUMBER(8) = 188 | COUNT_INDEX(8) = 14; |
| SEGMENT_NUMBER(9) = 199 | COUNT_INDEX(9) = 19; |
| SEGMENT_NUMBER(10) = 220 | COUNT_INDEX(10) = 19; |
| SEGMENT_NUMBER(11) = 330 | COUNT_INDEX(11) = 21; |
| SEGMENT_NUMBER(12) = 440 | COUNT_INDEX(12) = 23 |

-continued

| | |
|---|---|
| SEGMENT_NUMBER(13) = 550 | COUNT_INDEX(13) = 24; |
| SEGMENT_NUMBER(14) = 660 | COUNT_INDEX(14) = 25: |
| SEGMENT_NUMBER(15) = 770 | COUNT_INDEX(15) = 25; |
| SEGMENT_NUMBER(16) = 880 | |
| SEGMENT_NUMBER(17) = 990 | |
| SEGMENT_NUMBER(18) = 346 | |
| SEGMENT_NUMBER(19) = 678 | |
| SEGMENT_NUMBER(20) = 123 | |
| SEGMENT_NUMBER(21) = 876 | |
| SEGMENT_NUMBER(22) = 093 | |
| SEGMENT_NUMBER(23) = 456 | |
| SEGMENT_NUMBER(24) = 765 | |

This example assumes that the SEGMENT_NUMBER has 25 entries (0 TO 24). Each entry holds the identity of a segment number. The COUNT_INDEX has 16 entries (0 to 15). This assumes that there are 16 sectors within each segment.

If for example, we want to determine the identity of the segments having 9 (k=9) valid sectors, then we first retrieve the entry of COUNT_INDEX(k) and COUNT_INDEX(k-1) from the COUNT_INDEX. Thus, COUNT_INDEX(k-1) is equal to 14, and COUNT_INDEX(k) is equal to 19.

Then the numbers 14 and 19 respectively retrieved from COUNT_INDEX, are used as indices to the SEGMENT_NUMBER table. SEGMENT_NUMBER(14) is equal to 660 and SEGMENT_NUMBER(19-1) is equal to 346. The segments between SEGMENT_NUMBER(14) and SEGMENT_NUMBER(19-1), i.e. 660, 770, 880, 990, and 346, all have 9 valid sectors. 7 sectors are either discarded or erased. Furthermore, segments identified in the entry SEGMENT_NUMBER(0) to SEGMENT_NUMBER(14-1), i.e. 100, 111, 122 . . . to 550, have a number of valid sectors less than 9. Further, all segments indicated by SEGMENT_NUMBER(19) TO SEGMENT_NUMBER(25) have valid sectors more than 9.

COUNT_NUMBER(9)=COUNT_NUMBER(10)=19 means that no segment in the system has 10 sectors valid and 6 sectors discarded.

COUNT_NUMBER(0)=2 means that segment 100 and segment 111 have 0 sectors valid, e.g. all discarded and ready for erase.

If we discard 3 sectors in segment 188, which has 5 valid sectors, SEGMENT_NUMBER table and COUNT_INDEX will become:

| | |
|---|---|
| SEGMENT_NUMBER(0) = 100 | COUNT_INDEX(0) = 2; |
| SEGMENT_NUMBER(1) = 111 | COUNT_INDEX(1) = 2; |
| SEGMENT_NUMBER(2) = 122 | COUNT_INDEX(2) = 5; |
| SEGMENT_NUMBER(3) = 133 | COUNT_INDEX(3) = 7; |
| SEGMENT_NUMBER(4) = 188 | COUNT_INDEX(4) = 8; |
| SEGMENT_NUMBER(5) = 155 | COUNT_INDEX(5) = 10; |
| SEGMENT_NUMBER(6) = 144 | COUNT_INDEX(6) = 12; |
| SEGMENT_NUMBER(7) = 166 | COUNT_INDEX(7) = 13; |
| SEGMENT_NUMBER(8) = 177 | COUNT_INDEX(8) = 14; |
| SEGMENT_NUMBER(9) = 199 | COUNT_INDEX(9) = 19; |
| SEGMENT_NUMBER(10) = 220 | COUNT_INDEX(10) = 19; |
| SEGMENT_NUMBER(11) = 330 | COUNT_INDEX(11) = 21; |
| SEGMENT_NUMBER(12) = 440 | COUNT_INDEX(12) = 23; |
| SEGMENT_NUMBER(13) = 550 | COUNT_INDEX(13) = 24; |
| SEGMENT_NUMBER(14) = 660 | COUNT_INDEX(14) = 25: |
| SEGMENT_NUMBER(15) = 770 | COUNT_INDEX(15) = 25; |
| SEGMENT_NUMBER(16) = 880 | |
| SEGMENT_NUMBER(17) = 990 | |
| SEGMENT_NUMBER(18) = 346 | |

-continued

| |
|---|
| SEGMENT_NUMBER(19) = 678 |
| SEGMENT_NUMBER(20) = 123 |
| SEGMENT_NUMBER(21) = 876 |
| SEGMENT_NUMBER(22) = 093 |
| SEGMENT_NUMBER(23) = 456 |
| SEGMENT_NUMBER(24) = 765 |

Thus, segments 122, 133 and 188 will have 2 valid sectors, segments 155 and 144 have 3 valid sectors, segment 166 has 4 valid sectors and segments 177 and 199 each has 5 valid sectors. Therefore, COUNT_INDEX is used to minimize the effort required to update the SEGMENT_NUMBER table, and to indicate how many sectors in a segment are valid.

When COUNT_INDEX(0) is not 0, it means there are some all-discarded segments to be erased for use. Merge will only happen when COUNT_INDEX(0) is 0. If COUNT_INDEX(0) is not 0, then we can erase those segments and reuse them. If COUNT_INDEX(0) is 0 and COUNT_INDEX(1) is not 0, we can pick the segment in SEGMENT_NUMBER(0) for merge. After moving out the valid sector, the segment will become all-discarded.

If the SEGMENT_NUMBER table is empty (e.g. COUNT_INDEX(15)=0), we can search US sectors to collect those segments not fully valid. Of course, we do not need to search the entire array 10. Searching 8 US sectors may take about 1 ms. while searching the entire array 10 will take 800 ms.

From the foregoing, it can be seen that once the identity of the segments having particular number of valid sectors have been determined, a merge operation using conventional methods, can be used to merge the valid sectors of 2 or more different segments. This will then free up additional segments and cause them ready to be erased.

Therefore, by the foregoing method, it can be seen that having the additional indices, one can readily and quickly ascertain the identity of segments with particular number of valid sectors to start the merge operation.

Further, the storage of the identity of the segments in the SEGMENT_NUMBER table can be based upon ascending or descending number of valid sectors. In addition, the US sectors as well as the SEGMENT_NUMBER table and the COUNT_INDEX table can be volatile or non-volatile memory. In the former, of course, during boot up the associated microcontroller needs to search the entire array 10 and store the results in the US sectors and/or the SEGMENT_NUMBER table and the COUNT_INDEX table. However, changes thereafter to these sectors and indices can be effectuated much faster.

For memory arrays in which there are more than 16 sectors per segment (such as 32 sectors per segment) the following modifications can be made to the foregoing description. As can be seen from FIG. 3, each byte of the US sector has at most 5 bits to store the number of valid sector count. Thus, each byte of a US sector can store at most a number equal to 31 indicating the number of valid sectors. However, if there are 32 valid sectors per segment, the 5 bits would not be sufficient.

With respect to each byte of a US sector, bit fields 7 and 6 can store 1 and 0 respectively to indicate that the data which is stored in bit fields 0–5 is a link to the next free segment. Since there are 64 possible combinations, with one of the possible combinations reserved for the US sector, then there are at most 9 free segment link lists in each US sector (assuming each US sector to be 512 bytes, 9=(512/63)).

If each byte of the US sector has a "1" and "1" stored in bit fields 7 and 6 respectively, and bit fields 5 and 4 are reserved for PU and XPAGE functions respectively, then bit fields 0–3 storing all "0" indicates that the corresponding segment has all 32 sectors in the segment which are valid.

If each byte of the US sector has a "0" stored in bit field 7, and bit fields 6 and 5 are reserved for XPAGE and PU functions respectively, then bit fields 0–4 store a number indicating the number of valid sector count in the corresponding segment. Since bit fields 0–4 can store at most a number equal to 31, the $32^{nd}$ possibility is stored in the byte in which the bit combination "11" is stored in bit fields 7 and 6 respectively, as discussed above.

What is claimed is:

1. A non-volatile memory array having a plurality of non-volatile memory cells, arranged in a plurality of first groups with each first group having a plurality of memory cells, and a plurality of second groups, with each second group having a plurality of first groups, said memory array comprising:

a plurality of third groups of memory cells; each third group corresponding to a second group of memory cells;

each third group for storing a signal indicative of a status of said corresponding second group of memory cells; and each third group for storing an address signal indicative of another second group of memory cells having said same status.

2. The array of claim 1 wherein said second group of memory cells are erased together in an erase operation.

3. The array of claim 2 wherein said first group of memory cells are programmed together in an program operation.

4. The array of claim 1 wherein said status is indicative of all of said memory cells being erased.

5. The array of claim 4 further comprising:

a plurality of fourth groups of memory cells, each of said fourth groups for storing the location of one of said third group storing the signal indicative of said status.

6. The array of claim 5 wherein each of said third group for storing the number of first group of memory cells in said corresponding second group having valid data.

7. The array of claim 1 wherein said status is indicative of not all of said memory cells in said corresponding second group being erased.

8. The array of claim 1 further comprising:

a plurality of fourth groups of memory cells, each fourth group for storing a signal identifying a unique one of said second group; said fourth group arranged in an order based upon the number of first groups in each second group having the same status;

a plurality of fifth group of memory cells; having at least the same number as the number of first groups in each second group; each fifth group for storing a signal identifying a location within the plurality of fourth group.

9. A non-volatile memory array having a plurality of non-volatile memory cells arranged in a plurality of segments, wherein each segment has a plurality of sectors that are erased in the same erase operation, with each sector having a plurality of memory cells that are programmed in the same program operation, said array comprising:

a plurality of first group of memory cells; each first group having a corresponding segment of memory cells;

each first groups for storing a status signal indicative of said corresponding segment of memory cells being erased; and means for linking said plurality of first group storing said status signal.

10. The array of claim 9 wherein said linking means comprises:

each of said first groups for storing an address signal indicative of another of said first group of memory cells having said same status signal; and a plurality of second groups of memory cells for storing the location of a first one of said first group storing said status signal.

11. The array of claim 9 further comprising:

a segment number table comprising a plurality of storage sites; each storage site for storing a signal identifying a unique one of said segments; said storage sites arranged in an order based upon the number of sectors in each segment having the same status;

a count index table comprising a second plurality of storage sites having at least the same number at the number of sectors in each segment; each count index for storing a signal identifying a location within the segment number table.

12. The array of claim 11 wherein said status is indicative of a valid sector count.

13. The array of claim 12 wherein said signal stored in said count index table identifies the segments having the number of valid sector count.

14. A non-volatile memory array having a plurality of non-volatile memory cells, arranged in a plurality of first groups with each first group having a plurality of memory cells, and a plurality of second groups, with each second group having a plurality of first groups, said memory array comprising:

a plurality of third groups of memory cells having at least the same number as the number of second groups, each third group corresponding to a second group of memory cells, each third group for storing a signal identifying a unique one of said second group; said third group arranged in an order based upon the number of first groups in each second group having the same status;

a plurality of fourth group of memory cells; having at least the same number as the number of first groups in each second group; each fourth group for storing a signal identifying a location within the plurality of third groups.

15. A method of tracking the status of a plurality of first groups of non-volatile memory cells comprising:

providing a plurality of second groups of memory cells, each of said second group corresponding to one of said first group;

storing a status signal in one of said second group of memory cells, said status signal representing the status of the corresponding first group; and storing an address signal in said one of said second group of memory cells; said address signal representing the location of another second group having the same status.

16. The method of claim 15 wherein said second groups of memory cells are non-volatile memory cells.

17. The method of claim 15 wherein said status signal indicates said memory cells of said first group are erased.

18. A method of tracking the status of a plurality of sectors, each sector for storing a group of non-volatile memory cells, with a group of sectors in a segment, said method comprising:

providing a segment number table having a plurality of storage sites with each storage site corresponding to a segment;

providing a count index table having a second plurality of storage sites with the number of storage sites corresponding to the number of sectors in each segment;

storing in each segment number table the identity of each segment, with said segments arranged in an order based upon the number of sectors in each segment having the same status; and storing in each count index table a first number, which is an index to the segment number table for identifying segments having a second number of sectors with the status with the second number being an index to the count index table.

* * * * *